United States Patent
Ueno et al.

(10) Patent No.: US 6,917,322 B2
(45) Date of Patent: Jul. 12, 2005

(54) I/V CONVERTER CIRCUIT AND D/A CONVERTER

(75) Inventors: Masayuki Ueno, Chiba (JP); Masatoshi Takada, Chiba (JP); Hiroshi Ogasawara, Chiba (JP)

(73) Assignee: Kawasaki Microelectronics, Inc., Chiba (JP)

( * ) Notice: Subject to any disclaimer, the term of this patent is extended or adjusted under 35 U.S.C. 154(b) by 0 days.

(21) Appl. No.: 10/801,812

(22) Filed: Mar. 17, 2004

(65) Prior Publication Data

US 2004/0189497 A1 Sep. 30, 2004

(30) Foreign Application Priority Data

Mar. 28, 2003 (JP) ........................................ 2003-091282

(51) Int. Cl.[7] .............................................. H03M 1/66
(52) U.S. Cl. ...................................... 341/144; 327/103
(58) Field of Search ................................ 341/144, 135; 327/103, 158

(56) References Cited

U.S. PATENT DOCUMENTS

| | | | | |
|---|---|---|---|---|
| 4,982,192 A | * | 1/1991 | Murooka | 341/127 |
| 5,694,033 A | * | 12/1997 | Wei et al. | 323/315 |
| 6,002,354 A | * | 12/1999 | Itoh et al. | 341/144 |
| 6,259,302 B1 | * | 7/2001 | Phanse et al. | 327/362 |
| 6,504,736 B1 | * | 1/2003 | Ono | 363/73 |
| 6,522,175 B2 | | 2/2003 | Ueno et al. | 327/103 |
| 6,605,993 B2 | * | 8/2003 | Suzuki | 330/252 |

FOREIGN PATENT DOCUMENTS

| | | | | |
|---|---|---|---|---|
| EP | 0641069 | * | 8/1993 | H03F/3/45 |
| JP | 2002-118468 | | 4/2002 | H03M/1/74 |

* cited by examiner

Primary Examiner—Peguy JeanPierre
(74) Attorney, Agent, or Firm—Oliff & Berridge, PLC

(57) ABSTRACT

In an I/V converter circuit and a D/A converter, a wide pass band for signal can be obtained and current consumption can be reduced. A current is supplied through an input terminal to a first node, and a first bias current is supplied from a first bias-current generating circuit to the first node. The current supplied to the first node is mirrored to a second node, and a second bias current is supplied from a second bias-current generating circuit to the second node. A first control circuit controls first and second elements of a current mirror circuit so that the voltage of the first node is substantially equal to a bias voltage, a third element converts a current flowing therethrough to a voltage by using the bias voltage as reference, and a second control circuit controls the voltage output from an output terminal so that the voltage of the second node is substantially equal to the bias voltage.

6 Claims, 2 Drawing Sheets

I/V CONVERTER CIRCUIT AND D/A CONVERTER

BACKGROUND OF THE INVENTION

1. Field of Invention

The present invention relates to an I/V (current/voltage) converter circuit for converting current to voltage and a D/A converter using the same.

2. Description of Related Art

In a conventional D/A converter (hereinafter referred to as DAC), a current generating circuit, including a plurality of currentcells, generates a total current corresponding to the value of a digital signal, which is to be converted to an analog signal. An I/V converter circuit, which is also part of the DAC, converts the total current to a voltage, so that an analog signal having a voltage corresponding to the value of the digital signal is generated.

In the conventional DAC, however, a MOS transistor is generally used as the current generating circuit, and thus linearity failure may occur depending on the voltage of the analog signal. Also, in order to use the analog signal output from the DAC, the voltage of the analog signal generated by the DAC must be shifted in accordance with the input/output characteristics of a subsequent-stage circuit using the analog signal.

In this circumstance, an I/V converter circuit and a DAC are disclosed in this application, similarly to Japanese Unexamined Patent Application Publication No. 2002-118468 (hereinafter referred to as Patent Document), in which linearity failure of an analog signal can be overcome, and the level of the voltage of the analog signal can be shifted in accordance with the input/output characteristics of the subsequent-stage circuit.

FIG. 4 is a circuit diagram showing the configuration of an I/V converter circuit 40, which is disclosed in the Patent Document. The I/V converter circuit 40 shown in FIG. 4 includes N-type MOS transistors (hereinafter referred to as NMOSs) 42 and 44 forming a current mirror circuit; operational amplifiers 46 and 48; a P-type MOS transistor (hereinafter referred to as PMOS) 50; and a resistor 52 of a resistance R. Also, the circuit includes a current source 54 for generating a total current Isig, which corresponds to the value of a digital signal to be converted to an analog signal Vout, and which corresponds to a current supplied from the DAC. Finally, the circuit includes a current source 56 for generating a bias current Ib.

In the I/V converter circuit 40 disclosed in the Patent Document, the operational amplifier 46 controls the NMOSs 42 and 44 in the current mirror circuit so that the voltage of a node A is equal to a bias voltage Vb. Also, the operational amplifier 48 controls the PMOS 50 so that the voltage of a node B is equal to the bias voltage Vb. Further, the resistor 52 converts a current (Isig+Ib), mirrored from the NMOS 42 to the NMOS 44, to a voltage by using the bias voltage Vb as a reference voltage.

According to the I/V converter circuit 40 of the Patent Document, the voltage of the node A, that is, the source-drain voltage of a MOS transistor of the current source 54, can be fixed to a constant voltage. Therefore, linearity failure of the analog signal Vout can be overcome. Further, by adequately changing the bias current Ib, the bias voltage Vb, and the resistance R of the resistor 52 so as to change the output level of the analog signal Vout in accordance with the input/output characteristics of the subsequent-stage circuit, the analog signal Vout can be easily transmitted to the subsequent-stage circuit.

Accordingly, the analog signal Vout, which is calculated by the following equation (1), is output from the I/V converter circuit 40 according to the Patent Document:

$$Vout = R \cdot (Isig + Ib) + Vb = R \cdot Isig + R \cdot Ib + Vb. \tag{1}$$

Herein, $R \cdot Isig$ is a signal component and $R \cdot Ib + Vb$ is a clamp component.

That is, the voltage of the analog signal Vout is clamped by $R \cdot Ib + Vb$, and the clamp level can be arbitrarily set by changing the values of R, Ib, and Vb. However, the amplitude of a signal component changes when the value of R is changed. Also, as described above, by dynamically changing the value of Vb, linearity failure occurs and the performance of the D/A converter deteriorates. Therefore, the clamp level is controlled by changing the value of Ib while fixing the values of R and Vb.

However, by decreasing Ib, impedance increases and the pass band of the circuit narrows, which is inadequate for a high-speed operation. Therefore, the value of Ib must be set at a value at or beyond a predetermined value, according to a maximum frequency of the signal. On the other hand, current consumption increases when the value of Ib increases, and thus the value of Ib needs to be minimized in order to suppress current consumption. Therefore, in the conventional I/V converter circuit 40, a unit for controlling the value of Ib must be provided in order to set Ib at an adequate value.

SUMMARY OF THE INVENTION

An object of the present invention is to solve the above-described problems of the conventional art and to provide an I/V converter circuit and a D/A converter in which a wide pass band of a signal can be obtained, and current consumption can be reduced.

In order to achieve this goal, an I/V converter circuit, according to various exemplary embodiments of the present invention, includes a current mirror circuit having a first element connected between the ground and a first node and to which a current is supplied from an input terminal, and a second element connected between the ground and a second node, to which the current supplied to the first node is mirrored. The I/V converter also includes a first bias-current generating circuit, which supplies a first bias current to the first node and which adjusts the amount of the current supplied to the first node, and a first control circuit, which receives the voltage of the first node and a bias voltage at the input side and which controls the first and second elements of the current mirror circuit so that the voltage of the first node is substantially equal to the bias voltage. The I/V converter, according to various exemplary embodiments, also includes a second bias-current generating circuit, which supplies a second bias current to the second node and which adjusts the amount of the current supplied to the second node, a third element which is connected between the second node and an output terminal and which converts a current flowing therethrough to a voltage by using the bias voltage as a reference voltage, and a second control circuit which receives the voltage of the second node and the bias voltage at the input side and which controls the voltage output from the output terminal so that the voltage of the second node is substantially equal to the bias voltage.

Preferably, according to various exemplary embodiments, the second bias current is m times larger than the first bias current, and a current flowing through the second element of the current mirror circuit is m times larger than a current flowing through the first element.

Also, the first and second elements of the current mirror circuit may be N-type MOS transistors, the third element may be a resistor, and the first and second control circuits may be operational amplifiers.

The I/V converter circuit may further include a unit for changing the bias voltage.

A D/A converter according to various exemplary embodiments of the present invention includes a current generating circuit, for generating a total current corresponding to the value of a digital signal which is to be converted to an analog signal, and the above-described I/V converter circuit. The total current generated by the current generating circuit, according to various exemplary embodiments, is supplied from the input terminal of the I/V converter circuit to the first node.

DETAILED DESCRIPTION OF PREFERRED EMBODIMENTS

Hereinafter, an I/V converter circuit and a D/A converter using the same, according to preferred embodiments of the present invention, will be described with reference to the attached drawings.

Figure 1:
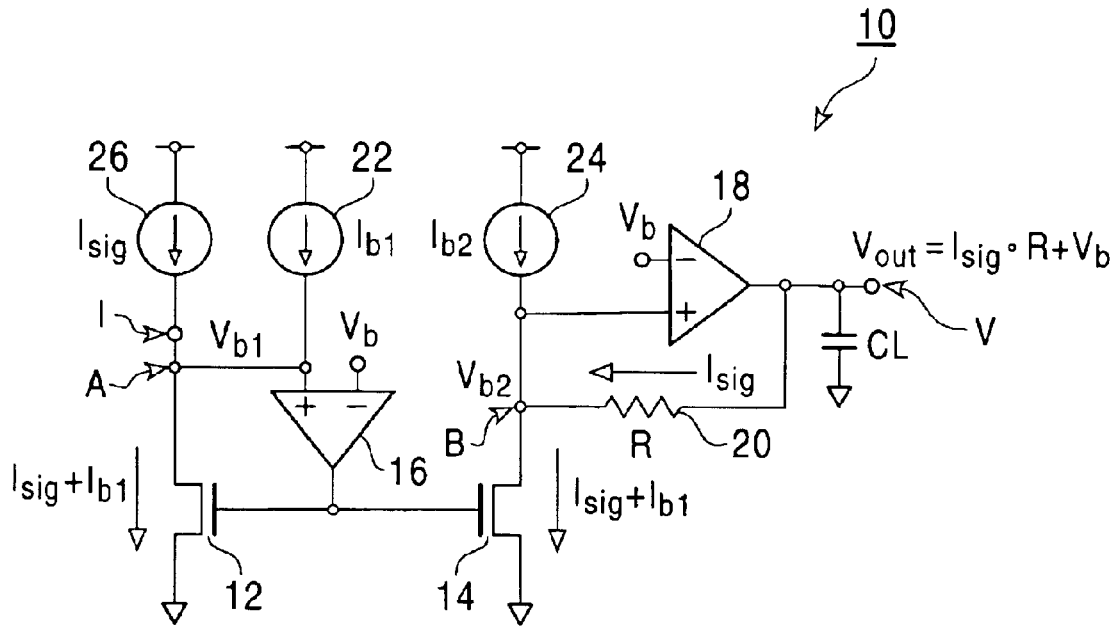
FIG. 1 is a circuit diagram showing the configuration of an I/V converter circuit, according to various embodiments of the present invention.

FIG. 1 is a circuit diagram showing the configuration of an I/V converter circuit 10 according to an embodiment of the present invention. The I/V converter circuit 10 shown in FIG. 1 serves as a current/voltage converter circuit used for the output stage of a D/A converter (hereinafter referred to as DAC) according to various exemplary embodiments of the present invention. The I/V converter includes N-type MOS transistors (hereinafter referred to as NMOSs) 12 and 14, operational amplifiers 16 and 18, an element 20, which may be a resistor, and current sources 22 and 24. Also, according to various exemplary embodiments, the circuit includes a current source 26, which represents a total current corresponding to the value of a digital signal and a load CL.

Herein, a common signal (output signal of the operational amplifier 16) is input to the gates of the NMOSs 12 and 14, and the NMOSs 12 and 14 form a current mirror circuit. That is, as will be described below, the same amount of current Isig+Ib1 constantly flows through the NMOSs 12 and 14. The NMOS 12 is connected between a node A and the ground, and the NMOS 14 is connected between a node B and the ground.

Each of the operational amplifiers 16 and 18 functions as a control circuit for adjusting the voltage of the output signal thereof so that the same voltage is input to the positive (+) terminal and the negative (−) terminal thereof. In the operational amplifier 16, a voltage Vb1 of the node A is input to the positive (+) terminal and a bias voltage Vb is input to the negative (−) terminal, and the output signal of the operation amplifier 16 is input to the gates of the NMOSs 12 and 14. In the operational amplifier 18, a voltage Vb2 of the node B is input to the positive (+) terminal and a bias voltage Vb is input to the negative (−) terminal and the output signal of operational amplifier 18 is output as an analog signal Vout from an output terminal V.

Element 20, according to various exemplary embodiments, is a resistor for converting a current I flowing therethrough to a voltage V by using the voltage Vb2 of the node B as a reference voltage, and is located between the output terminal V and the node B. The resistance of element 20 is R.

The current source 22, according to various exemplary embodiments, serves as a current generating circuit for generating a bias current Ib1 for fine adjustments of the current amount and supplying the bias current Ib1 to the node A. The current source 22 is connected between a power supply and the node A. Likewise, according to various exemplary embodiments, the current source 24 serves as a current generating circuit for generating a bias current Ib2 for fine adjustments of the current amount and supplying the bias current Ib2 to the node B. The current source 24 is located between a power supply and the node B.

The current source 26 serves as a current generating circuit for generating the total current Isig corresponding to the value of a digital signal, which is to be converted to the analog signal Vout, in the DAC according to various exemplary embodiments of the present invention. The total current Isig is supplied from an input terminal I of the I/V converter circuit 10 to the node A. The DAC, according to the various exemplary embodiments of the present invention, includes this current generating circuit and the I/V converter circuit 10 shown in FIG. 1.

Next, the operation of the I/V converter circuit 10, according to various exemplary embodiments, will be described.

The total current Isig is supplied from the current source 26 to the node A through the input terminal I. The total current Isig changes in accordance with the value of a digital signal that is to be converted to the analog signal Vout by the DAC according to various exemplary embodiments of the present invention.

In the I/V converter circuit 10, the voltage of the output signal of the operational amplifier 16 changes so that the voltage Vb1 of the node A is constantly equal to the bias voltage Vb regardless of change in the total current Isig. The output signal of the operational amplifier 16 is input to the gate of the NMOS 12, so that the on-resistance of the NMOS 12 changes. Accordingly, the voltage Vb1 of the node A is controlled so as to be constantly equal to the bias voltage Vb, regardless of change in the total current Isig.

Accordingly, in the I/V converter circuit 10, the voltage Vb1 of the node A, that is, a voltage Vds between the source and drain of a MOS transistor serving as the current source 26 for generating the total current Isig corresponding to the value of the digital signal, is controlled so as to be kept at a constant value. Accordingly, linearity failure of the DAC can be overcome.

The NMOSs 12 and 14 form a current mirror circuit, as described above. A current Isig+Ib1, which is created by adding the total current Isig supplied from the current source 26 and the bias current m1 supplied from the current source 22, flows through the NMOS 12. Therefore, as in the NMOS 12, the on-resistance of the NMOS 14 changes in accordance with the output signal of the operational amplifier 16, and the same amount of current Isig+Ib1 as in the NMOS 12 thus constantly flows through the NMOS 14.

Moreover, the voltage of the analog signal Vout, which is output from the output terminal V, that is, the voltage of the output signal of the operational amplifier 18, changes so that the voltage Vb2 of the node B is constantly equal to the bias voltage Vb. As described above, since a current flowing through the NMOS 14 is Isig+Ib1, a current flowing through element 20 is Isig+Ib1−Ib2. Accordingly, if Ib1 is approximately equal to (≈) Ib2, then the current flowing through element 20 is Isig.

The current Isig flowing through element 20, according to various exemplary embodiments, is I/V converted by the resistance R, and is output as the analog signal Vout=Isig·R+Vb2. Thus, since Vb1≈Vb2≈Vb, the analog signal is represented by Vout=Isig·R+Vb.

That is, the voltage of the analog signal Vout is clamped by the voltage Vb2 of the node B, which is approximately equal to the bias voltage Vb. Therefore, by adequately setting the bias voltage Vb in accordance with the input/output characteristics of a subsequent-stage circuit which uses the analog signal Vout of the DAC, the output level of the analog signal Vout can be changed, and thus the analog signal Vout can be easily transmitted to the subsequent-stage circuit.

Furthermore, the voltage of the analog signal Vout does not depend on the values of the bias currents Ib1 and Ib2. Therefore, a circuit for controlling the values of the bias currents Ib1 and Ib2 is not necessary, and the circuit can be miniaturized, thus the cost can be reduced. Also, the bias currents Ib1 and Ib2 can be set at or beyond a predetermined value, according to a maximum frequency of the signal, while minimizing the bias currents Ib1 and Ib2, so that the current consumption can be reduced. Finally, the load CL is directly driven by the operational amplifier 18. Therefore, even when the total current Isig is equal to zero (0) and no current flows through element 20, the impedance does not increase and thus the pass band is not narrowed.

Next, a case where the output amplification factor is changed in the I/V converter circuit 10 shown in FIG. 1, according to various exemplary embodiments, will be described.

Figure 2:
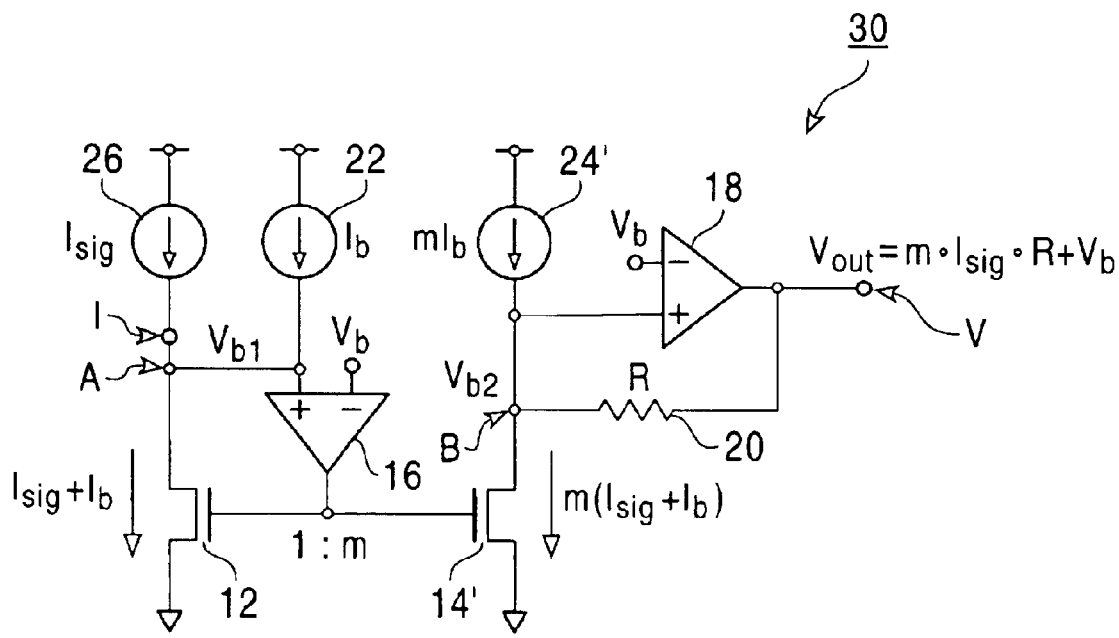
FIG. 2 is a circuit diagram showing the configuration of an I/V converter circuit, according to various embodiments of the present invention.

FIG. 2 is a circuit diagram showing the configuration of an I/V converter circuit 30, according to various embodiments of the present invention. In the I/V converter circuit 30 shown in FIG. 2, a current source 24' and a NMOS 14' are used instead of the current source 24 and the NMOS 14 of the I/V converter circuit 10 shown in FIG. 1. A current flowing through the current source 24' and the NMOS 14' is m times larger than the current flowing through the current source 24 and the NMOS 14. Otherwise, the configuration of the I/V converter circuit 30 is the same as that of the I/V converter circuit 10, and thus the same elements are denoted by the same reference numerals and the corresponding description will be omitted.

Figure 3:
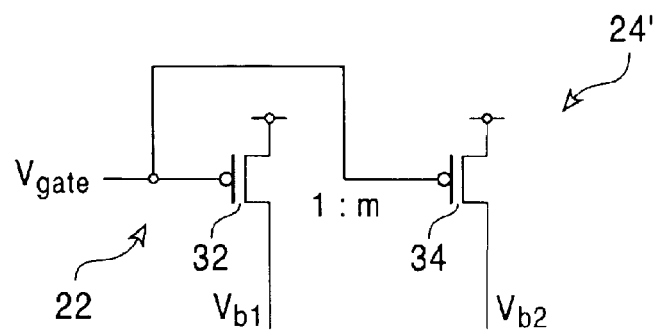
FIG. 3 is a circuit diagram showing the configuration of current sources according to various embodiments of the present invention.
Figure 4:
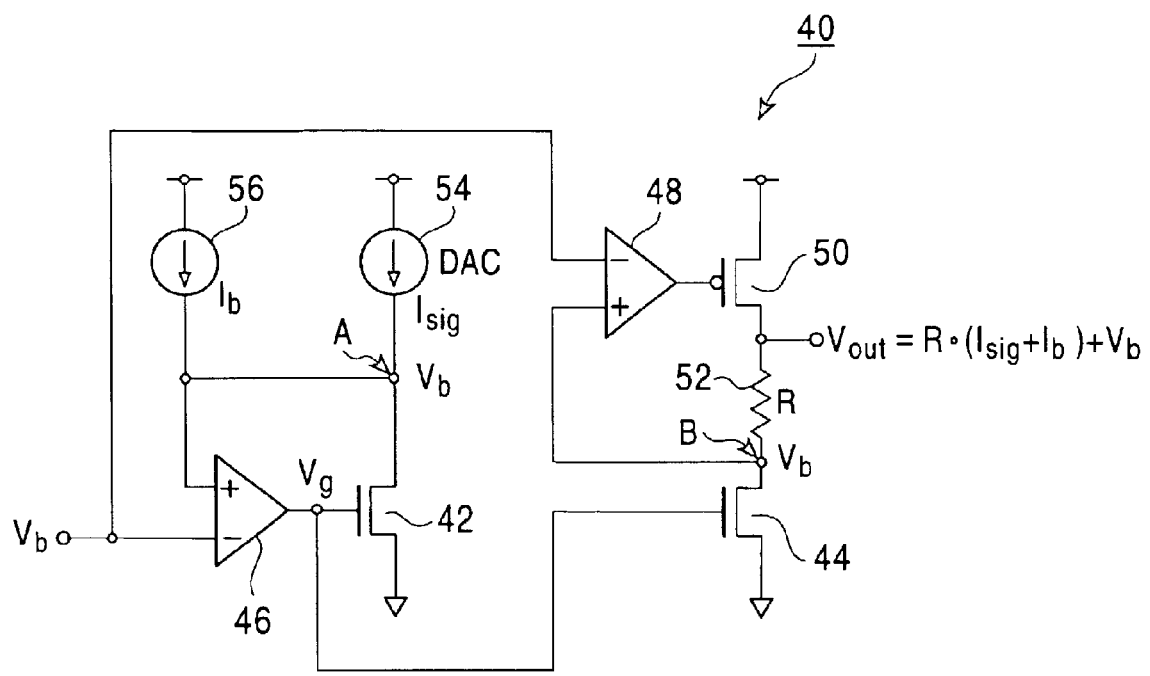
FIG. 4 is a circuit diagram showing the configuration of a conventional I/V converter circuit.

FIG. 3 is a circuit diagram showing the configuration of current sources, according to various exemplary embodiments. As shown in FIG. 3, the current sources 22 and 24' are formed by using P-type MOS transistors (hereinafter referred to as PMOSs) 32 and 34. The PMOS 32 is connected between the power supply and node A and the PMOS 34 is connected between the power supply and node B. Furthermore, a signal Vgate is input to the gates of the PMOSs 32 and 34, so that a current mirror circuit is formed.

Accordingly, the transistor size of the PMOS 34 is m times larger than the transistor size of the PMOS 32. Therefore, when a bias current generated by the current source 22 is Ib, a bias current generated by the current source 24' is m·Ib.

Likewise, the transistor size of the NMOS 14' constituting the current mirror circuit is m times larger than that of the NMOS 12. Therefore, since a current flowing through the NMOS 12 is Isig+Ib, a current flowing through the NMOS 14' is m·(Isig+Ib).

Accordingly, the analog signal Vout output from the output terminal V can be represented by the following equation (2):

$$\text{Vout}=\{m\cdot(Isig+Ib)-m\cdot Ib\}\cdot R+Vb2=m\cdot Isig\cdot R+Vb. \quad (2)$$

As can be understood from this equation, the analog signal Vout does not depend on the bias current Ib at all, even when the output amplification factor is increased m times.

In the exemplary embodiments shown in FIGS. 1 and 2, the I/V converter circuit is realized by using NMOSs 12 and 14 (14') as current mirror circuits and the operational amplifiers 16 and 18 as control circuits. However, the present invention is not limited to this configuration, and the I/V converter circuit according to the present invention may be formed by using another configuration for realizing the same function. Preferably, a unit for setting the bias voltage Vb may be provided so that the bias voltage Vb can be changed in accordance with the input/output characteristics of the subsequent-stage circuit.

The DAC according to the present invention uses the I/V converter circuit according to the present invention, examples of which are shown in FIGS. 1 and 2, as the output stage of the current generating circuit. Any type of current generating circuit may be used as long as it generates a total current corresponding to the value of a digital signal which should be converted to an analog signal, and any conventional current generating circuit may be used.

However, the present invention is not limited to the above-described exemplary embodiments, and various improvements and modifications may be performed without deviating from the scope of the present invention.

According to various exemplary embodiments of the present invention, linearity failure in the DAC can be overcome, and the output level of the analog signal can be changed in accordance with the input/output characteristics of the subsequent-stage circuit. Furthermore, since the voltage of the analog signal Vout does not depend on the value of the bias current, a circuit for controlling the value of the bias current is not necessary. Accordingly, the circuit can be miniaturized and the cost can be reduced. Also, since the bias current can be set at or beyond a predetermined value in accordance with the maximum frequency of the signal, while at the same time minimizing it, current consumption can be reduced. Finally, since the load is directly driven by the operational amplifier 18, which serves as a second control circuit, the pass band of the analog signal is not narrowed even when no current flows through the resistor.

What is claimed is:

1. An I/V converter circuit comprising:
    a current mirror circuit including:
    a first element connected to the ground and a first node to which a current is supplied from an input terminal, and
    a second element connected to the ground and a second node to which the current supplied to the first node is mirrored;
    a first bias-current generating circuit which supplies a first bias current to the first node and which adjusts the amount of the current supplied to the first node;
    a first control circuit which receives the voltage of the first node and a bias voltage at the input side and which controls the first and second elements of the current mirror circuit so that the voltage of the first node is substantially equal to the bias voltage;

a second bias-current generating circuit which supplies a second bias current to the second node and which adjusts the amount of the current supplied to the second node;

a third element which is connected between the second node and an output terminal and which converts a current flowing therethrough to a voltage by using the bias voltage as a reference voltage; and a second control circuit which receives the voltage of the second node and the bias voltage at the input side and which controls the voltage output from the output terminal so that the voltage of the second node is substantially equal to the bias voltage.

2. The I/V converter circuit according to claim 1, wherein the second bias current is m times larger than the first bias current, and a current flowing through the second element of the current mirror circuit is m times larger than a current flowing through the first element.

3. The I/V converter circuit according to claim 1, wherein the first and second elements of the current mirror circuit are N-type MOS transistors, the third element is a resistor, and the first and second control circuits are operational amplifiers.

4. The I/V converter circuit according to claim 1, further comprising a controller that changes the bias voltage at the input site of the first control circuit.

5. An I/V converter circuit comprising:

a first circuit that adds a current supplied from an input terminal and a first bias current for adjusting the amount of the current and for mirroring the added current;

a second circuit that adjusts the amount of the mirrored current by a second bias current; and a controller that biases a predetermined voltage to a voltage obtained by I/V converting the current adjusted by the second bias current and for outputting the obtained voltage.

6. A D/A converter comprising:

a current generating circuit for generating a total current corresponding to the value of a digital signal which is to be converted to an analog signal; and the I/V converter circuit according to claim 1, wherein the total current generated by the current generating circuit is supplied from the input terminal of the I/V converter circuit to the first node.

* * * * *